United States Patent
Ko et al.

(10) Patent No.: US 8,420,450 B2
(45) Date of Patent: Apr. 16, 2013

(54) METHOD OF MOLDING SEMICONDUCTOR PACKAGE

(75) Inventors: Jun-young Ko, Cheonan-si (KR);
Jae-yong Park, Cheonan-si (KR);
Heui-seog Kim, Asan-si (KR); Ho-geon Song, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 41 days.

(21) Appl. No.: 13/094,216

(22) Filed: Apr. 26, 2011

(65) Prior Publication Data
US 2011/0318887 A1 Dec. 29, 2011

(30) Foreign Application Priority Data
Jun. 28, 2010 (KR) .................. 10-2010-0061268

(51) Int. Cl.
*H01L 21/16* (2006.01)

(52) U.S. Cl.
USPC ............ 438/126; 438/15; 438/106; 438/107; 438/108; 438/112; 438/114; 438/124; 438/125; 438/127; 257/667; 257/787; 257/E23.116; 257/E23.128; 257/E21.502

(58) Field of Classification Search .......... None
See application file for complete search history.

(56) References Cited

U.S. PATENT DOCUMENTS

| 5,889,232 A * | 3/1999 | Ichikawa et al. ............ 174/524 |
| 7,435,625 B2 * | 10/2008 | Condie et al. ................ 438/124 |
| 2010/0007026 A1 * | 1/2010 | Shikano ........................ 257/773 |

FOREIGN PATENT DOCUMENTS

| JP | 4-165634 | 6/1992 |
| JP | 6-314756 | 11/1994 |
| JP | 7-302809 | 11/1995 |
| JP | 2004-14883 | 1/2001 |

OTHER PUBLICATIONS

"SiLK material" data sheet.*

* cited by examiner

*Primary Examiner* — Julio J Maldonado
*Assistant Examiner* — Yasser Abdelaziez
(74) *Attorney, Agent, or Firm* — Onello & Mello, LLP

(57) ABSTRACT

A method of molding a semiconductor package includes coating liquid molding resin or disposing solid molding resin on a top surface of a semiconductor chip arranged on a substrate. The solid molding resin may include powdered molding resin or sheet-type molding resin. In a case where liquid molding resin is coated on the top surface of the semiconductor chip, the substrate is mounted between a lower molding and an upper molding, and then melted molding resin is filled in a space between the lower molding and the upper molding. In a case where the solid molding resin is disposed on the top surface of the semiconductor chip, the substrate is mounted on a lower mold and then the solid molding resin is heated and melts into liquid molding resin having flowability. An upper mold is mounted on the lower mold, and melted molding resin is filled in a space between the lower molding and the upper molding.

12 Claims, 3 Drawing Sheets

US 8,420,450 B2

METHOD OF MOLDING SEMICONDUCTOR PACKAGE

CROSS-REFERENCE TO RELATED APPLICATIONS

This application claims the benefit under 35 U.S.C. 119 of Korean Patent Application No. 10-2010-0061268, filed in the Korean Intellectual Property Office on Jun. 28, 2010, the entire contents of which are incorporated herein by reference.

BACKGROUND

The inventive concept relates to a method of molding a semiconductor package, and more particularly, to a method of molding a semiconductor package by which molding resin may be smoothly filled in a narrow gap between semiconductor chips and a mold.

Portable electronic devices, such as mobile telephones, PDAs, portable music players, and the like, have been developed to have various and increasingly numerous functions. As a result, they have also been increasingly miniaturized. Semiconductor packages used in the portable electronic devices have also been developed to have various functions, to be small, and to be thin. For example, the number of semiconductor chips arrayed in a semiconductor package has increased, while the height of the semiconductor package has decreased.

During molding of the semiconductor package, a gap between top surfaces of the semiconductor chips and the mold becomes narrow. When the gap between the top surfaces of the semiconductor chips and the mold becomes narrow, for example, when the gap is equal to or less than 150 µm, molding resin may not fill in the narrow gap in a smooth manner.

SUMMARY

The inventive concept provides a method of molding a semiconductor package by which molding resin may be smoothly filled in a narrow gap between semiconductor chips and a mold.

According to one aspect, the inventive concept is directed to a method of molding a semiconductor package. The method includes: arranging a semiconductor chip on a substrate; applying liquid molding resin on a top surface of the semiconductor chip; mounting the substrate on a lower mold; mounting an upper mold on the lower mold; and inserting melted molding resin into a space between the lower mold and the upper mold.

In some embodiments, the semiconductor chip comprises a plurality of semiconductor chips stacked in a step manner, and applying the liquid molding resin comprises inserting the liquid molding resin into a space between the plurality of semiconductor chips and the substrate.

In some embodiments, the liquid molding resin is liquid thermosetting resin having flowability at room temperature.

In some embodiments, the liquid molding resin is applied to the top surface of the semiconductor chip in such a manner that a thickness of the liquid molding resin at a center part of the top surface of the semiconductor chip is greater than a thickness of a gap between the top surface of the semiconductor chip and the upper mold.

In some embodiments, when the upper mold is mounted on the lower mold, the liquid molding resin applied on the top surface of the semiconductor chip is pressed by the upper mold and spreads to fill the gap between the upper mold and the top surface of the semiconductor chip.

In some embodiments, a thickness of the gap between the upper mold and the top surface of the semiconductor chip is equal to or less than about 150 µm.

In some embodiments, the liquid molding resin is melted solid powdered molding resin.

In some embodiments, the liquid molding resin is melted solid sheet-type molding resin.

According to another aspect, the inventive concept is directed to a method of molding a semiconductor package. The method includes: arranging a semiconductor chip on a substrate; disposing solid molding resin on a top surface of the semiconductor chip; mounting the substrate on a lower mold; heating the solid molding resin to melt the solid molding resin into liquid molding resin having flowability; mounting an upper mold on the lower mold; and inserting melted molding resin into a space between the lower mold and the upper mold.

In some embodiments, the solid molding resin comprises powdered molding resin.

In some embodiments, the solid molding resin comprises sheet-type molding resin.

In some embodiments, a thickness of the solid molding resin is greater than a thickness of a gap between the upper mold and the top surface of the semiconductor chip.

In some embodiments, a thickness of the gap between the upper mold and the top surface of the semiconductor chip is equal to or less than about 150 µm.

In some embodiments, heating the solid molding resin comprises heating the lower mold.

In some embodiments, the lower mold is heated to a temperature of about 180° C.

According to another aspect, the inventive concept is directed to a method of molding a semiconductor package. The method includes: arranging a semiconductor chip on a substrate; applying liquid molding resin on a top surface of the semiconductor chip, the liquid molding resin being one of: 1) liquid thermosetting resin having flowability at room temperature, ii) melted solid powdered molding resin, and iii) melted solid sheet-type molding resin; mounting the substrate on a lower mold; mounting an upper mold on the lower mold, such that, when the upper mold is mounted on the lower mold, the liquid molding resin applied on the top surface of the semiconductor chip is pressed by the upper mold and spreads to fill a gap between the bottom-facing inner surface of the upper mold and the top surface of the semiconductor chip; and inserting melted molding resin into a space between the lower mold and a bottom-facing inner surface of the upper mold.

In some embodiments, the liquid molding resin is applied to the top surface of the semiconductor chip such that a thickness of the liquid molding resin at a center part of the top surface of the semiconductor chip is greater than a thickness of the gap between the top surface of the semiconductor chip and the bottom-facing inner surface of the upper mold.

In some embodiments, the semiconductor chip comprises a plurality of semiconductor chips stacked in a step manner; and further comprising inserting the liquid molding resin into a space between the plurality of semiconductor chips and the substrate.

In some embodiments, a thickness of the gap between the bottom-facing inner surface of the upper mold and the top surface of the semiconductor chip is equal to or less than about 150 µm.

In some embodiments, the method further comprises heating the lower mold to heat the liquid molding resin.

BRIEF DESCRIPTION OF THE DRAWINGS

The foregoing and other features and advantages of the inventive concept will be apparent from the more particular description of preferred aspects of the inventive concept, as illustrated in the accompanying drawings in which like reference characters refer to the same parts throughout the different views. The drawings are not necessarily to scale, emphasis instead being placed upon illustrating the principles of the inventive concept. In the drawings, the thickness of layers and regions are exaggerated for clarity.

DETAILED DESCRIPTION OF THE EMBODIMENTS

Hereinafter, the inventive concept will be described in detail by describing exemplary embodiments of the inventive concept with reference to the attached drawings.

FIGS. 1A to 1D are schematic diagrams illustrating a semiconductor package molding method involving using liquid molding resin, according to an exemplary embodiment of the inventive concept.

Figure 1A:
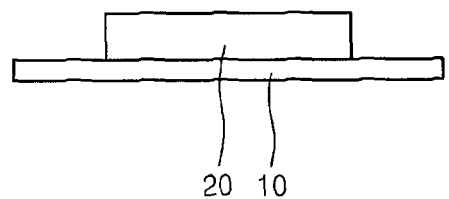
FIGS. 1A to 1D are schematic diagrams illustrating a semiconductor package molding method involving using liquid molding resin, according to an exemplary embodiment of the inventive concept.

Referring to FIG. 1A, a substrate 10 having a semiconductor chip 20 arranged thereon is prepared. In some exemplary embodiments, the substrate 10 may be a printed circuit board (PCB). According to the embodiments of the inventive concept, the semiconductor chip 20 may be a single semiconductor chip. Alternatively, the chip 20 may also be formed by vertically stacking two or more semiconductor chips. Alternatively, the chip 20 may be formed by horizontally arraying a plurality of semiconductor chips on the substrate 10. The semiconductor chip 20 may be electrically connected to the substrate 10 in a wire bonding manner, a flip-chip bonding manner, or another manner.

Figure 1B:
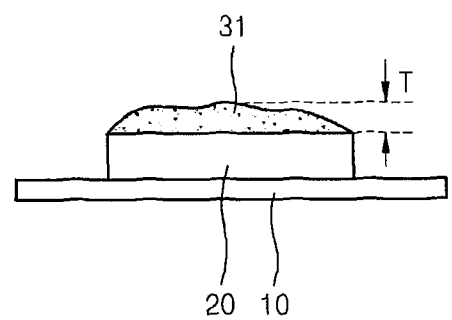

Next, as illustrated in FIG. 1B, liquid molding resin 31 is formed as a coating on a top surface of the semiconductor chip 20. In some embodiments, the liquid molding resin 31 may be liquid thermosetting resin having flowability at room temperature. For example, from among various types of epoxy mold compounds (EMCs) that are generally used as molding resin for a semiconductor package, an EMC having flowability at room temperature may be used.

Figure 1C:
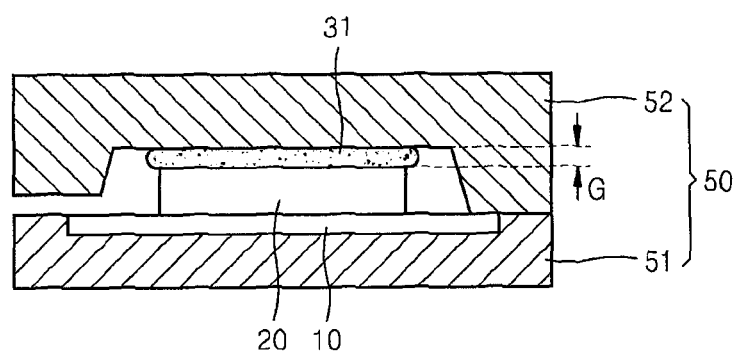

In some exemplary embodiments, the liquid molding resin 31 may be formed as a coating in such a mariner that a thickness T of the liquid molding resin 31 at a center part of the top surface of the semiconductor chip 20 is greater than a gap G between the top surface of the semiconductor chip 20 and a bottom-facing inner surface of an upper mold 52, as illustrated in FIG. 1C. In some exemplary embodiments, the liquid molding resin 31 may be coated to completely cover the top surface of the semiconductor chip 20. However, this is an exemplary embodiment only. In accordance with other exemplary embodiments, a coating area occupied by the liquid molding resin 31 may not completely cover the top surface of the semiconductor chip 20. That is, in some exemplary embodiments, it may be sufficient that the liquid molding resin 31 is formed as a coating on 50% or more of the entire top surface including the center part of the semiconductor chip 20.

Next, as illustrated in FIG. 1C, the substrate 10 is mounted in a mold 50. Specifically, the substrate 10 is mounted on a lower mold 51, and then the upper mold 52 is mounted on the lower mold 51. As the upper mold 52 and the lower mold 51 are brought together to be mounted, the liquid molding resin 31 coated on the top surface of the semiconductor chip 20 is pressed by the upper mold 52 so that the liquid molding resin 31 spreads to fill the gap G between the bottom-facing inner surface of the upper mold 52 and the top surface of the semiconductor chip 20.

Figure 1D:
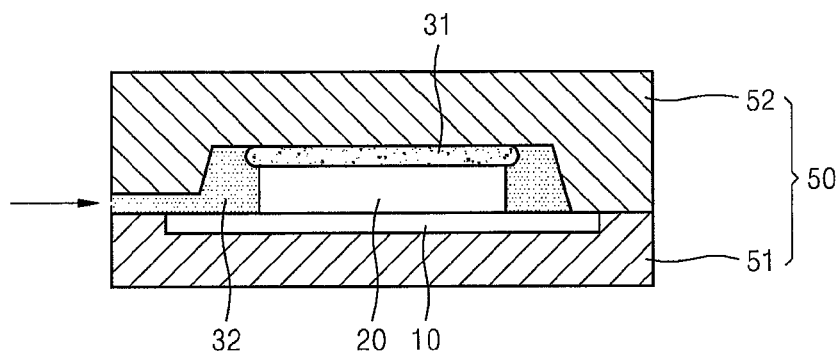

Next, as illustrated in FIG. 1D, melted molding resin 32 is inserted into a space between the lower mold 51 and the upper mold 52. When the melted molding resin 32 is introduced into the space between the lower mold 51 and the upper mold 52, since the liquid molding resin 31 is already filled in the gap G between the upper mold 52 and the top surface of the semiconductor chip 20, the melted molding resin 32 may smoothly fill the space. In some exemplary embodiments, the melted molding resin 32 may be formed by hot-melting solid thermosetting resin, e.g., a solid EMC, at a predetermined temperature.

Next, when the molding resin 31 and 32 are heated at a predetermined temperature and hardened, a semiconductor package molded by molding resin is produced.

As described above, according to the present inventive concept, by previously applying the liquid molding resin 31 on the top surface of the semiconductor chip 20, the liquid molding resin 31 sufficiently fills in the gap G, having a width equal to or less than, for example, 150 μm, between the bottom-facing inner surface of the upper mold 52 and the top surface of the semiconductor chip 20. Thus, flaws in the semiconductor package, which may occur by insufficient filling of molding resin during a semiconductor package manufacturing procedure, are eliminated according to the inventive concept.

Figure 2:
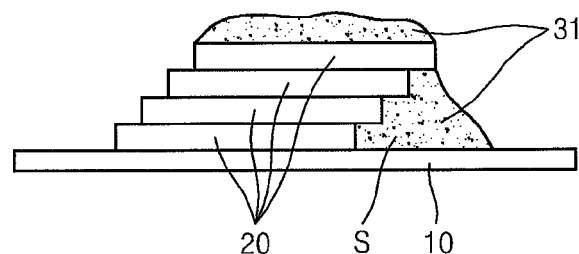
FIG. 2 is a schematic diagram illustrating a semiconductor package molding method for a semiconductor package having a plurality of semiconductor chips stacked in a step manner, according to an exemplary embodiment of the inventive concept.

FIG. 2 is a schematic diagram illustrating a method of molding a semiconductor package according to another exemplary embodiment of the inventive concept. In the embodiment of FIG. 2, the molding method produces a semiconductor package having a plurality of semiconductor chips 20 stacked in a step manner, according to embodiments of the inventive concept. Referring to FIG. 2, as noted above, the plurality of semiconductor chips 20 is stacked on a substrate 10 in a step manner. In this step stacking configuration, a narrow space S is formed between the substrate 10 and the plurality of semiconductor chips 20, as shown in FIG. 2. According to the present inventive concept, a liquid molding resin 31 is applied as a coating in the space S while the liquid molding resin 31 is applied as a coating on a top surface of the plurality of semiconductor chips 20. By applying the liquid molding resin in the space S, the problem that the liquid molding resin 31 is not smoothly filled in the space S between the substrate 10 and the plurality of semiconductor chips 20 is prevented.

Following the steps shown in FIG. 2, the method of molding thereafter is the same as the molding method described in detail above with reference to FIGS. 1C and 1D, and thus description thereof is not repeated here.

Figure 3A:
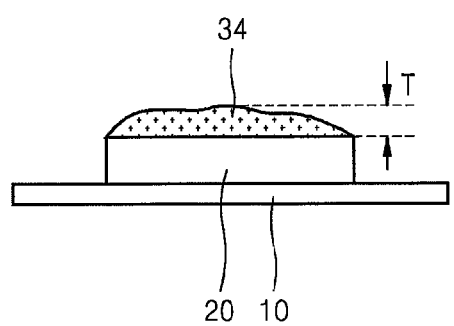
FIGS. 3A and 3B are schematic diagrams illustrating a semiconductor package molding method involving using powdered molding resin, according to an exemplary embodiment of the inventive concept.
Figure 3B:
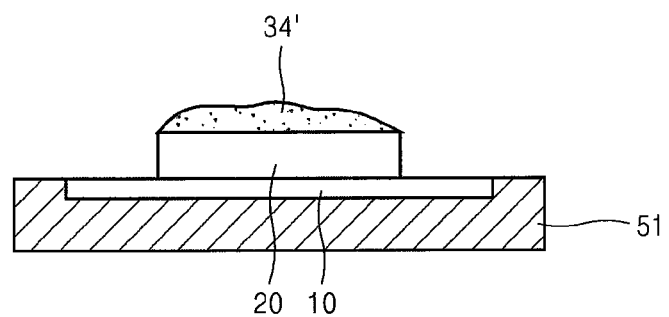

FIGS. 3A and 3B are schematic diagrams illustrating a semiconductor package molding method involving using powdered molding resin 34, according to another embodiment of the inventive concept. That is, in the embodiments of the inventive concept illustrated in FIGS. 3A and 3B, a powdered molding resin 34 is used instead of the liquid molding resin 31 used in the embodiments described above in detail.

Referring to FIG. 3A, according to this exemplary embodiment, a substrate 10 having a semiconductor chip 20 arranged thereon is prepared. Next, the powdered molding resin 34 is applied as a coating on a top surface of the semiconductor chip 20. The powdered molding resin 34 may be thermosetting resin, e.g., an EMC.

The powdered molding resin 34 may be applied on the top surface of the semiconductor chip 20 in such a manner that a thickness T of the powdered molding resin 34 at a center part of the top surface of the semiconductor chip 20 is greater than a gap G between the top surface of the semiconductor chip 20 and the bottom-facing inner surface of the upper mold 52, as illustrated in FIG. 1C. In some embodiments, the powdered molding resin 34 may be coated to completely cover the top surface of the semiconductor chip 20. Alternatively, the powdered molding resin 34 may be coated to cover at least about 50% or more of the entire top surface including the center part of the semiconductor chip 20.

Next, as illustrated in FIG. 3B, the substrate 10 is mounted on a lower mold 51. Then, the powdered molding resin 34 is heated. The heating causes the powdered molding resin 34 to melt into liquid molding resin 34' having flowability. In some embodiments, the heating of the powdered molding resin 34 may be achieved via the lower mold 51. That is, in some particular exemplary embodiments, if the lower mold 51 is heated and maintained at a temperature of, for example, about 180° C., the powdered molding resin 34 that is on the top surface of the semiconductor chip 20 receives heat transferred from the lower mold 51 via the substrate 20 and the semiconductor chip 20, and melts into a liquid state. Next, the upper mold 52 is mounted on the lower mold 51. As described above in detail with reference to FIG. 1C, as the upper mold 52 and the lower mold 51 are brought together, the liquid molding resin 34' on the top surface of the semiconductor chip 20 is pressed by the upper mold 52 and spread to fill the gap G between the upper mold 52 and the top surface of the semiconductor chip 20.

The molding method of the embodiments of FIGS. 3A and 3B thereafter is the same as the molding method described above in detail with reference to FIG. 1D, and thus a description thereof is not repeated here.

Figure 4A:
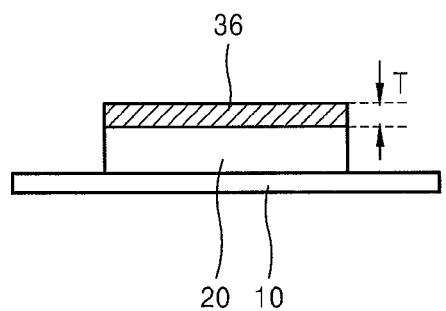
FIGS. 4A and 4B are schematic diagrams illustrating a semiconductor package molding method involving using sheet-type molding resin, according to an exemplary embodiment of the inventive concept.
Figure 4B:
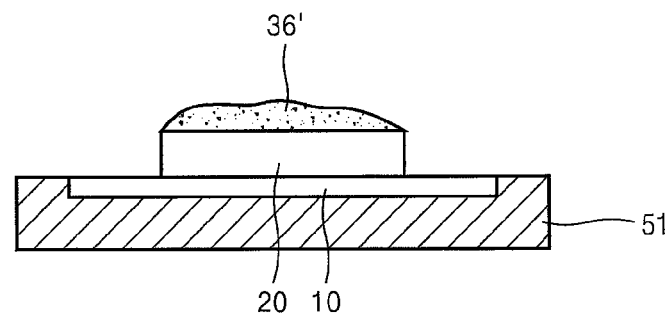

FIGS. 4A and 4B are schematic diagrams illustrating a semiconductor package molding method involving using sheet-type molding resin 36, according to another exemplary embodiment of the inventive concept. That is, in the exemplary embodiments of FIGS. 4A and 4B, sheet-type molding resin 36 is used in the packaging method instead of powdered molding resin 34 or liquid molding resin 31, described above in connection with the other embodiments of the inventive concept.

Referring to FIG. 4A, a substrate 10 having a semiconductor chip 20 arranged thereon is prepared. Next, the sheet-type molding resin 36 in a solid state is disposed on a top surface of the semiconductor chip 20. In some exemplary embodiments, the sheet-type molding resin 36 may be thermosetting resin, e.g., an EMC.

The sheet-type molding resin 36 may have a thickness T that is greater than a gap G between the top surface of the semiconductor chip 20 and the bottom-facing inner surface of the upper mold 52, as illustrated in FIG. 1C. Also, in some embodiments, a size of the sheet-type molding resin 36 may be sufficient to completely cover the top surface of the semiconductor chip 20. Alternatively, in some exemplary embodiments, the size of the sheet-type molding resin 36 may be sufficient to cover at least about 50% or more of the entire top surface of the semiconductor chip, including a center part of the semiconductor chip 20.

Next, as illustrated in FIG. 4B, the substrate 10 is mounted on a lower mold 51. Next, the sheet-type molding resin 36 is heated. The heating causes the sheet-type molding resin 36 to melt into sheet-type molding resin 36' having flowability. In some particular exemplary embodiments, the heating of the sheet-type molding resin 36 may be achieved via the lower mold 51. That is, in some particular exemplary embodiments, if the lower mold 51 is heated and maintained at a temperature of for example, about 180° C., the sheet-type molding resin 36 that is disposed on the top surface of the semiconductor chip 20 receives heat transferred from the lower mold 51 via the substrate 20 and the semiconductor chip 20, and melts into a liquid state. Next, the upper mold 52 is mounted on the lower mold 51. As described above in detail with reference to FIG. 1C, as the upper mold 52 and the lower mold 51 are brought together, the sheet-type molding resin 36' on the top surface of the semiconductor chip 20 is pressed by the upper mold 52 and spread to fill the gap G between the upper mold 52 and the top surface of the semiconductor chip 20.

The molding method of the embodiments of FIGS. 4A and 4B thereafter is the same as the molding method described above in detail with reference to FIG. 1D, and thus a description thereof is not repeated here.

As described above, the effect described in relation to FIGS. 1A to 1D may also be achieved by the embodiments in which the powdered molding resin 34 is previously coated on the top surface of the semiconductor chip 20, or the sheet-type molding resin 36 is disposed on the top surface of the semiconductor chip 20.

While the inventive concept has been particularly shown and described with reference to exemplary embodiments thereof, it will be understood that various changes in form and details may be made therein without departing from the spirit and scope of the following claims.

What is claimed is:

1. A method of molding a semiconductor package, comprising:
   arranging a semiconductor chip on a substrate;
   applying liquid molding resin on a top surface of the semiconductor chip;
   mounting the substrate on a lower mold;
   mounting an upper mold on the lower mold; and
   inserting melted molding resin into a space between the lower mold and the upper mold,
   wherein the semiconductor chip comprises a plurality of semiconductor chips stacked in a step manner, and
   applying the liquid molding resin comprises inserting the liquid molding resin into a space between the plurality of semiconductor chips and the substrate.

2. The method of claim 1, wherein the liquid molding resin is liquid thermosetting resin having flowability at room temperature.

3. A method of molding a semiconductor package, comprising:
   arranging a semiconductor chip on a substrate;
   applying liquid molding resin on a top surface of the semiconductor chip;
   mounting the substrate on a lower mold;
   mounting an upper mold on the lower mold; and inserting melted molding resin into a space between the lower mold and the upper mold, wherein the liquid molding resin is applied to the top surface of the semiconductor chip in such a manner that a thickness of the liquid molding resin at a center part of the top surface of the semiconductor chip is greater than a thickness of a gap between the top surface of the semiconductor chip and the upper mold.

4. The method of claim 3, wherein, when the upper mold is mounted on the lower mold, the liquid molding resin applied on the top surface of the semiconductor chip is pressed by the upper mold and spreads to fill the gap between the upper mold and the top surface of the semiconductor chip.

5. The method of claim 3, wherein a thickness of the gap between the upper mold and the top surface of the semiconductor chip is equal to or less than about 150 μm.

6. The method of claim 1, wherein the liquid molding resin is melted solid powdered molding resin.

7. The method of claim 1, wherein the liquid molding resin is melted solid sheet-type molding resin.

8. A method of molding a semiconductor package, comprising:

arranging a semiconductor chip on a substrate;

applying liquid molding resin on a top surface of the semiconductor chip, the liquid molding resin being one of: i) liquid thermosetting resin having flowability at room temperature, ii) melted solid powdered molding resin, and iii) melted solid sheet-type molding resin;

mounting the substrate on a lower mold;

mounting an upper mold on the lower mold, such that, when the upper mold is mounted on the lower mold, the liquid molding resin applied on the top surface of the semiconductor chip is pressed by the upper mold and spreads to fill a gap between the bottom-facing inner surface of the upper mold and the top surface of the semiconductor chip; and inserting melted molding resin into a space between the lower mold and a bottom-facing inner surface of the upper mold.

9. The method of claim 8, wherein the liquid molding resin is applied to the top surface of the semiconductor chip such that a thickness of the liquid molding resin at a center part of the top surface of the semiconductor chip is greater than a thickness of the gap between the top surface of the semiconductor chip and the bottom-facing inner surface of the upper mold.

10. The method of claim 8, wherein the semiconductor chip comprises a plurality of semiconductor chips stacked in a step manner; and further comprising inserting the liquid molding resin into a space between the plurality of semiconductor chips and the substrate.

11. The method of claim 8, wherein a thickness of the gap between the bottom-facing inner surface of the upper mold and the top surface of the semiconductor chip is equal to or less than about 150 μm.

12. The method of claim 8, further comprising heating the lower mold to heat the liquid molding resin.

* * * * *